United States Patent [19]

Iesaka et al.

[11] Patent Number: 4,949,143

[45] Date of Patent: Aug. 14, 1990

[54] SEMICONDUCTOR DEVICES AND METHOD OF MANUFACTURING THE SAME

[75] Inventors: Mamoru Iesaka; Shinji Uya; Nozomu Harada, all of Kanagawa, Japan

[73] Assignee: Kabushiki Kaisha Toshiba, Kawasaki, Japan

[21] Appl. No.: 296,324

[22] Filed: Jan. 11, 1989

Related U.S. Application Data

[63] Continuation of Ser. No. 904,296, Sep. 8, 1986, abandoned.

[30] Foreign Application Priority Data

Sep. 12, 1985 [JP] Japan .................................. 60-202114

[51] Int. Cl.⁵ ............................................ H01L 29/78
[52] U.S. Cl. ........................................ 357/24; 377/57;
377/62; 377/63; 358/213.23; 358/213.25
[58] Field of Search ................. 357/24 M, 24, 24 LR;
358/213.23, 213.25; 377/57, 62, 63

[56] References Cited

U.S. PATENT DOCUMENTS

| | | | |
|---|---|---|---|
| 3,967,254 | 6/1976 | Kosonocky et al. | 357/24 |
| 4,246,591 | 1/1981 | Kosonocky et al. | 357/24 M |
| 4,271,419 | 6/1981 | Hornbeck | 357/24 M |
| 4,528,596 | 7/1985 | Cope | 357/24 LR |
| 4,586,010 | 4/1986 | Linnenbrink | 357/24 |
| 4,721,989 | 1/1988 | Yamada | 357/24 LR |

OTHER PUBLICATIONS

IEEE International Solid-State Circuits Conference, Session IX "A 490X404 Element Imager for a Single--Chip Color Camera", K. Horii et al., 1985, pp. 96-97.

Primary Examiner—Andrew J. James
Assistant Examiner—Ngan Van Ngo
Attorney, Agent, or Firm—Foley, Lardner, Schwartz, Jeffery, Schwaab, Mack, Blumenthal & Evans

[57] ABSTRACT

The semiconductor devices include a semiconductor substrate, a first CCD region formed at the surface of said substrate, and a second CCD region having a side connected to said first CCD. A channel region of the first CCD region has a different channel potential at a latter part of the end transfer electrode corresponding to the portion of the first CCD region connected to the second CCD region.

13 Claims, 13 Drawing Sheets

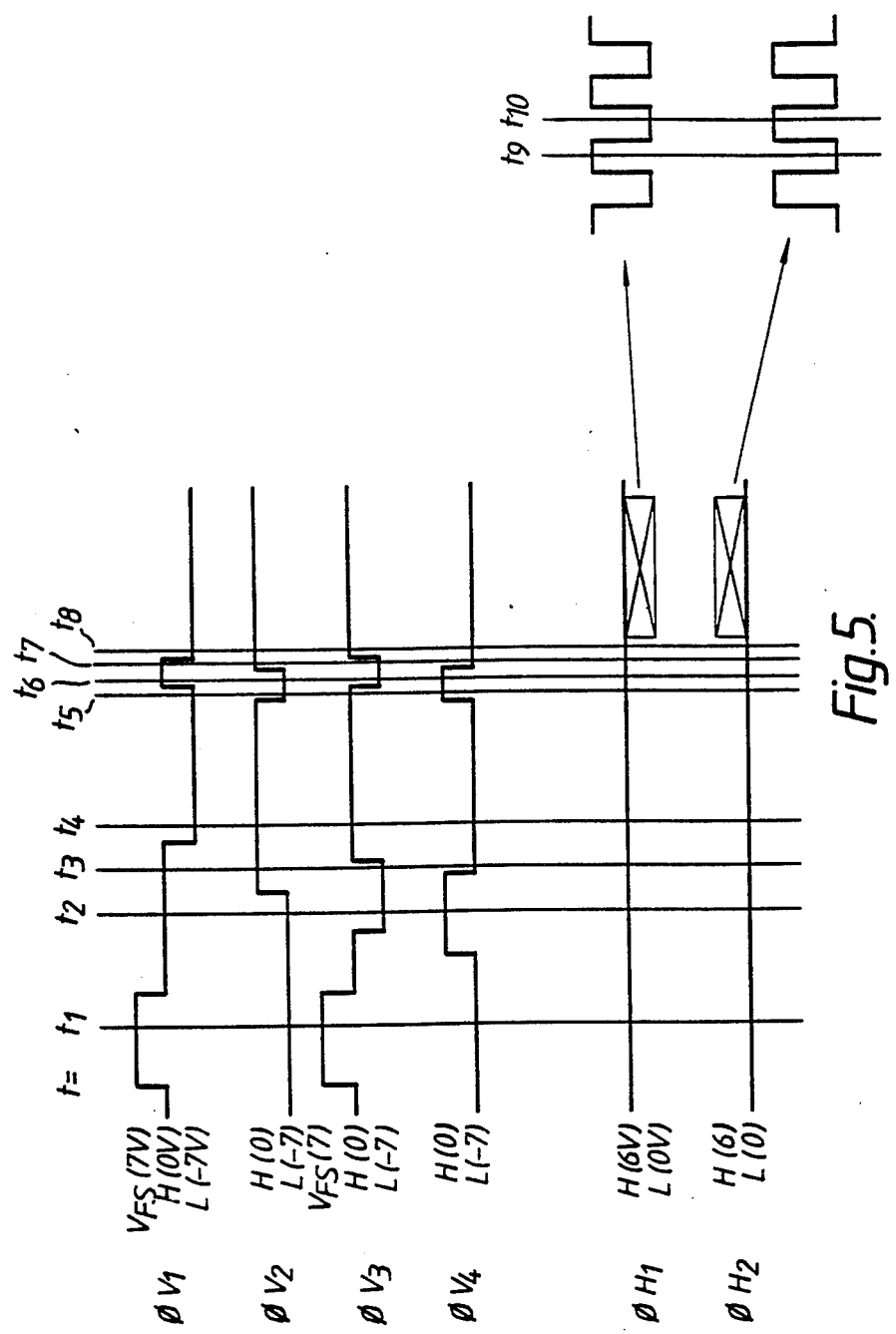

SEMICONDUCTOR DEVICES AND METHOD OF MANUFACTURING THE SAME

This application is a continuation of application Ser. No. 904,296, filed Sept. 8, 1986, now abandoned.

BACKGROUND OF THE INVENTION

The present invention relates to semiconductor devices and a method of manufacturing the same, and especially relates to an improvement for solid state image sensors.

Solid state image sensors have been investigated for the use in different types of equipment such as video cameras. Interline CCD image sensors are well known image sensors which are commonly used for this type of application.

FIG. 1 shows a cross sectional view of a unit cell of this type of well known device. At the surface of a p-type Si (silicon) substrate 1, n-type region 2 is formed corresponding to a picture element. This region is a photodiode that performs photoelectric conversion of incident light form an image, and accumulates electric charges obtained. Adjacent to the n-type region 2, an n-type channel region 3 is formed as a buried channel of the vertical CCD (charge coupled device). The $p^+$-type region 4 is a channel stopper. In the vertical CCD region, with gate insulating films therebetween, double poly-Si films for transfer electrodes 5 and 6 are formed. Furthermore, onto this substrate, a light shield film 7 of Al that covers the CCD region is stacked, and a passivation film 8 of $SiO_2$ is formed.

FIG. 2 shows the structure of an entire chip of the interline CCD image sensor. $P_{11}$, $P_{12}$, ..., $P_{mn}$ are the picture elements arranged in a matrix form, and 21 denotes a plurality of vertical CCD regions that are adjacent to the picture element lines. 22 shows a lateral CCD region that reads out the electric charges transferred to it by the vertical CCD regions 21. Each vertical CCD region 21 ordinarily comprises a four electrode cell CCD and is driven by a four phase clock producing pulse signals $V_1$ through $V_4$. The lateral CCD region 22 is a two electrode cell CCD and is driven by a two phase clock producing signals $H_1$ and $H_2$.

FIG. 3a through FIG. 3c show the transfer steps from the vertical CCD region to the lateral CCD region. In FIG. 3a, the electric charges 31 are positioned in a potential well beneath the transfer electrode that is formed before the end transfer electrode 33 of the vertical CCD region. These electric charges 31 are transferred to the storage transfer electrode 34 of the lateral CCD region when the end transfer electrode 33 opens as shown in FIG. 3b. After this step, the voltage of the clock pulse signals $V_3$ and $V_4$ becomes low, and then the transfer in the lateral CCD region begins. FIG. 3d shows the charges being transferred in the lateral CCD region. FIG. 3d also shows p-type impurities 36 introduced into the channel region.

However, one technical problem associated with this technique is the existence of residual charges 37 left behind in the transferring step of FIG. 3b in which charges are transferred toward the lateral CCD region. Such residual charges degrade the quality of the displayed image. For instance, these charges decrease the amount of electric charges transferred to the lateral CCD region. Although the residual charges diffuse into the substrate after this step, some are mixed with other signals that come in the next transferring step. In this case, if the next signal is a vacant signal corresponding to an unilluminated area, the signal would not be expressed exactly as a dark signal. Thus, all the picture elements along the vertical CCD line suffer the effect of the residual charges.

SUMMARY OF THE INVENTION

Accordingly, an object of the present invention is to provide an improved semiconductor device having connected CCD regions.

Another object of the present invention is to improve an imperfect charge transfer at the connected area of the CCDs.

Another object of the present invention is to provide a semiconductor device which produces an improved displayed image.

Another object of the present invention is to provide an improved method of making semiconductor devices.

In accomplishing the foregoing objects, there is provided according to this invention a semiconductor device, comprising: a semiconductor substrate; a first CCD region formed at the surface of the substrate; a second CCD region having a side to which the first CCD region is connected; wherein, a channel region of the first CCD region has a different channel potential at a part of the end transfer electrode which is connected to the side of the second CCD region, as compared to the rest of the end transfer electrode.

According to another object of this invention there is provided an improved semiconductor device, comprising: a semiconductor substrate; a plurality of charge accumulation regions which accumulate electric charges obtained by photoelectric conversion and are formed at the surface of the semiconductor substrate; a plurality of first CCD regions which transfer the electric charges of the charge accumulation regions; a second CCD region having a side to which the first CCD regions are connected; wherein, a channel region of each the first CCD regions has a different channel potential at a part of the end transfer electrode connected to the side of the second CCD region as compared to the rest of the end transfer electrode.

According to another object of this invention there is provided an improved method of manufacturing semiconductor devices, comprising the steps of: (i) forming channel stopper regions on the surface of a semiconductor substrate; (ii) forming a plurality of transfer electrodes of a first CCD region and of a second CCD region of which the first CCD region is connected to the side; wherein, before forming the end transfer electrode of the first CCD region, impurities that have an opposite type of conductivity to the semiconductor substrate are introduced into the channel regions of a part of the end transfer electrode.

BRIEF DESCRIPTION OF THE DRAWINGS

This invention, together with its various features and advantages, will be readily understood from the following more detailed description presented in conjunction with the following drawings in which:

FIG. 5 is a timing chart of signal pulses for operating the device shown in FIG. 4;

DETAILED DESCRIPTION OF THE PREFERRED EMBODIMENTS

Figure 1:
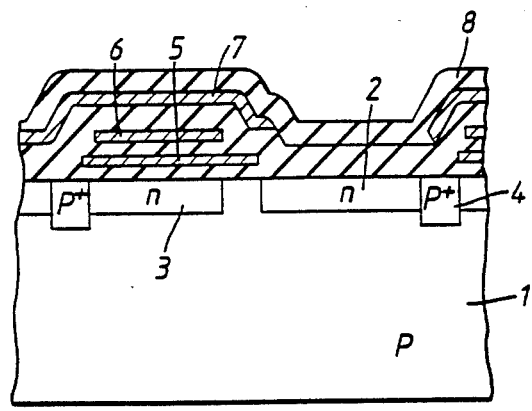
FIG. 1 is a cross sectional view showing a unit cell of a prior art solid state image sensor.
Figure 2:
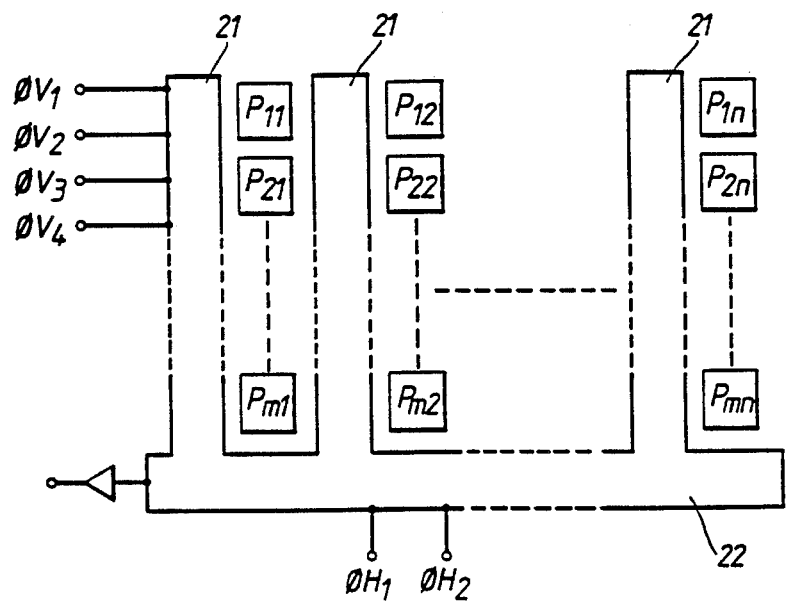
FIG. 2 is a plan view showing the layout of the prior art solid state image sensor which is formed on a Si substrate.
Figure 3A:
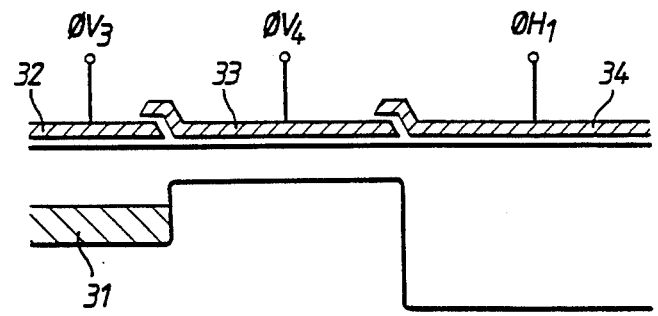
FIG. 3a through FIG. 3d show cross sectional views describing the transferring of the electric charges in the prior art solid state image sensor.
Figure 3B:
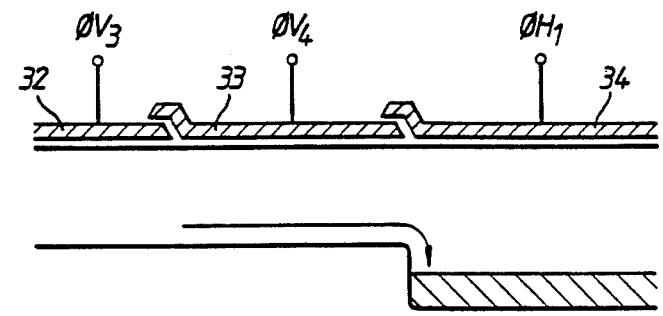
Figure 3C:
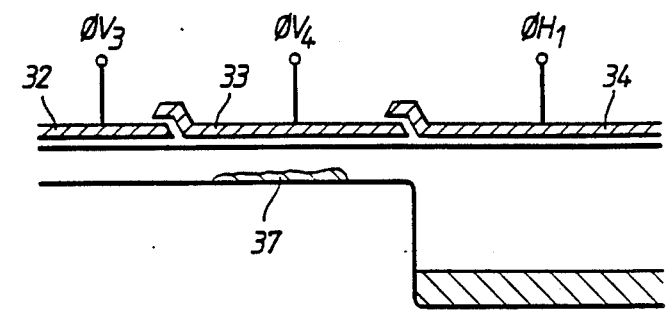
Figure 3D:
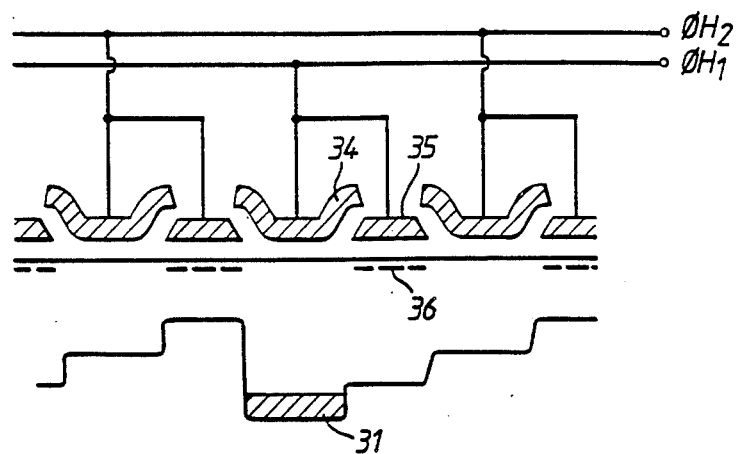
Figure 4A:
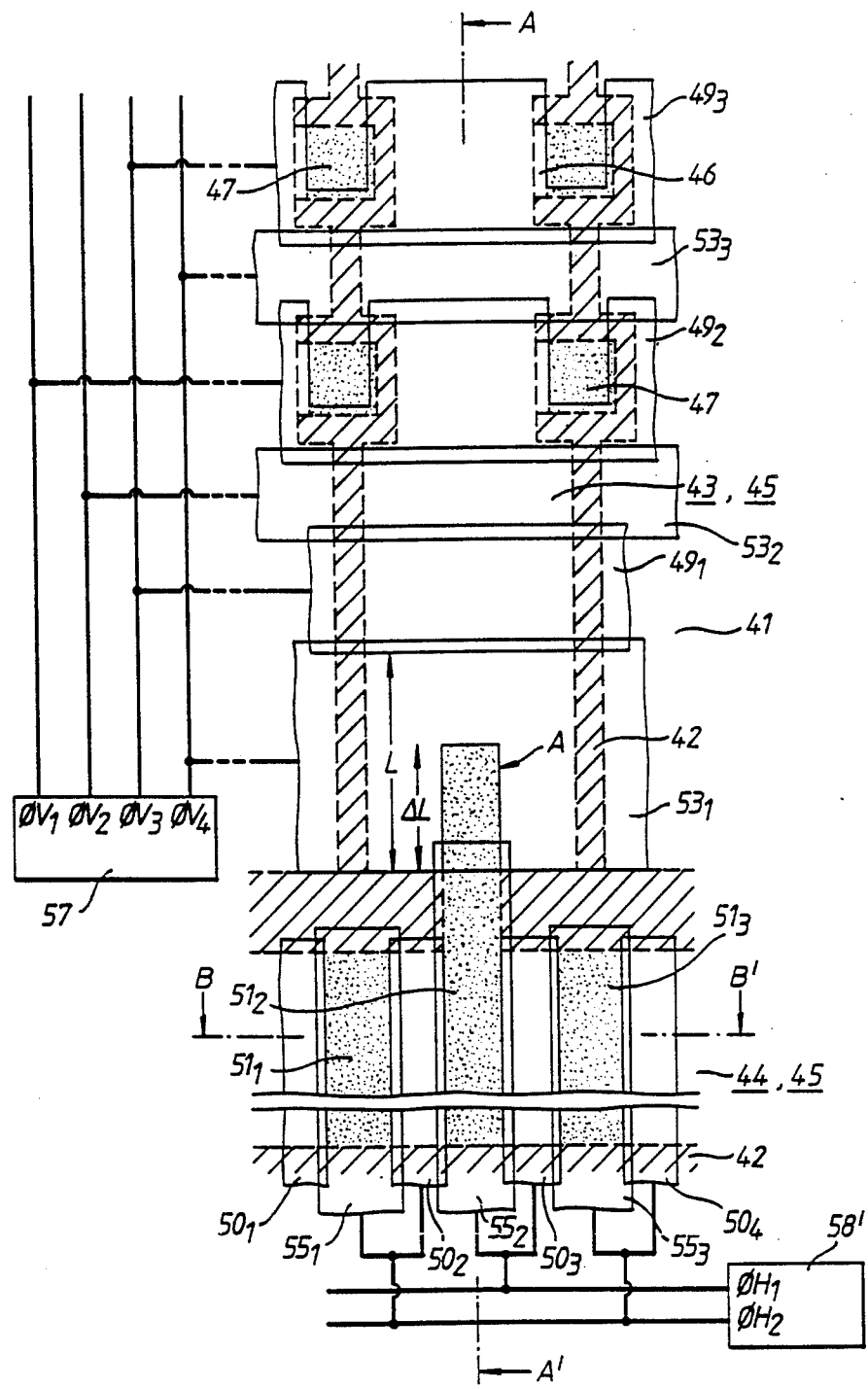
FIG. 4a is a top plan view of a sensor according to the present invention

FIG. 4a shows a plan view of one of the connection areas of the vertical CCD region (first CCD region) and the lateral CCD region (second CCD region) to which the present invention is applied. The layout of each block shown in FIG. 2 is also common to this embodiment.

Figure 4B:
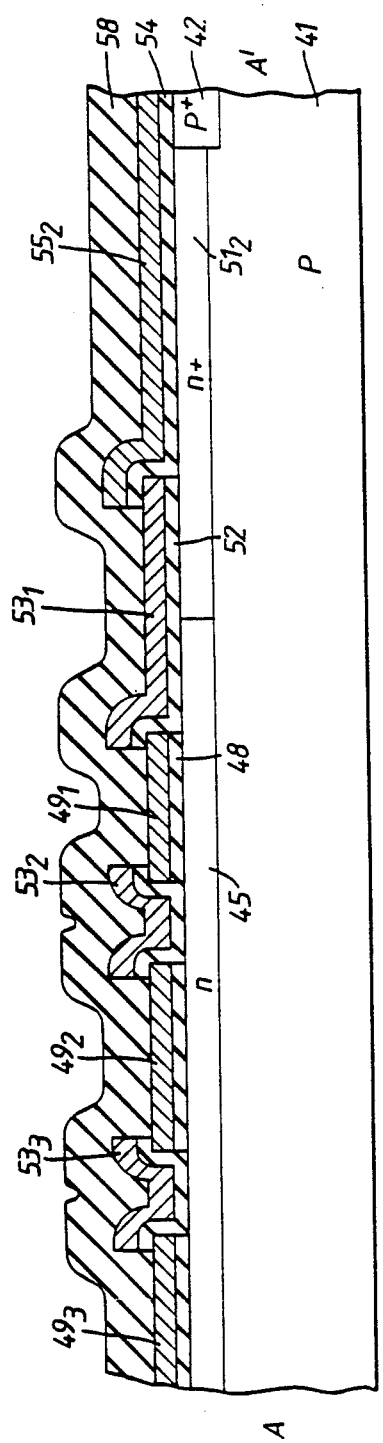
FIGS. 4b through FIG. 4f are cross sectional views which schematically illustrate the manufacturing steps and the structure of the solid state image sensor according to the present invention.
Figure 4C:
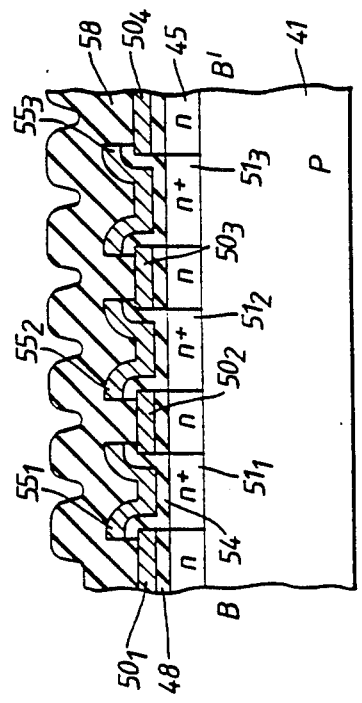

FIG. 4b and FIG. 4c are cross sectional views at A-A' and B-B' in FIG. 4a.

In this embodiment, at the surface of a p-type Si substrate 41 of impurity density $2 \times 10^{15}$ cm$^{-3}$, channel stop regions 42 of p$^+$-type are formed. These regions are indicated as shaded regions in FIG. 4a.

Over the entire surface of vertical CCD regions 43 and a lateral CCD region 44, n-type channel region 45 of impurity density $6 \times 10^{17}$ cm$^{-3}$ is formed. Spaced by a gap 46 from the vertical CCD region 43, n-type charge accumulation region 47 of impurity density $1.5 \times 10^{17}$/cm$^3$ is formed. This region 47 accumulates electric charges obtained by a photoelectric conversion that occurs at the p-n junction of this region. The gap 46 functions as a channel between the charge accumulation region 47 and the vertical CCD region 43.

A gate oxide film 48 of 900 Å thickness and a first poly-Si layer are formed on the substrate. That is, transfer electrodes $49_1$, $49_2$, $49_3$ . . . of the vertical CCD region 43 and barrier transfer electrodes $50_1$, $50_2$, $50_3$, $50_4$, . . . are formed. In the regions between the barrier transfer electrodes, n$^+$-type regions $51_1$, $51_2$, $51_3$ . . . are formed by performing P$^+$ ion implementation at 120 KeV, $7 \times 10^{11}$ cm$^{-2}$. The n$^+$ type region $51_2$ is formed extending to a latter part of the channel region (A) that belongs to the end transfer electrode. Further, gate oxide films 52 of 900 Å and transfer electrodes $53_1$, $53_2$, 53 . . . are formed of a second poly-Si layer. The electrode $53_2$ is the end electrode of the vertical CCD region 43. The channel length of the end transfer electrode $53_1$ in this embodiment is the widest of the transfer electrodes in the vertical CCD region 43. Moreover, gate oxide films 54 of 900 Å and storage transfer electrodes $55_1$, $55_2$, $55_3$ . . . of a third poly-Si layer are formed for the lateral CCD region 44. The edge of the storage transfer electrode $55_2$ overlaps the end transfer electrode $53_1$. In this embodiment, 56 is a CVD SiO$_2$ film formed over the upper surface. The light shield film is not shown in this figure. 57 and 58' are clock pulse generators respectively.

Adding to the description of the structure described, the manufacturing method will be discussed below.

Figure 4D:
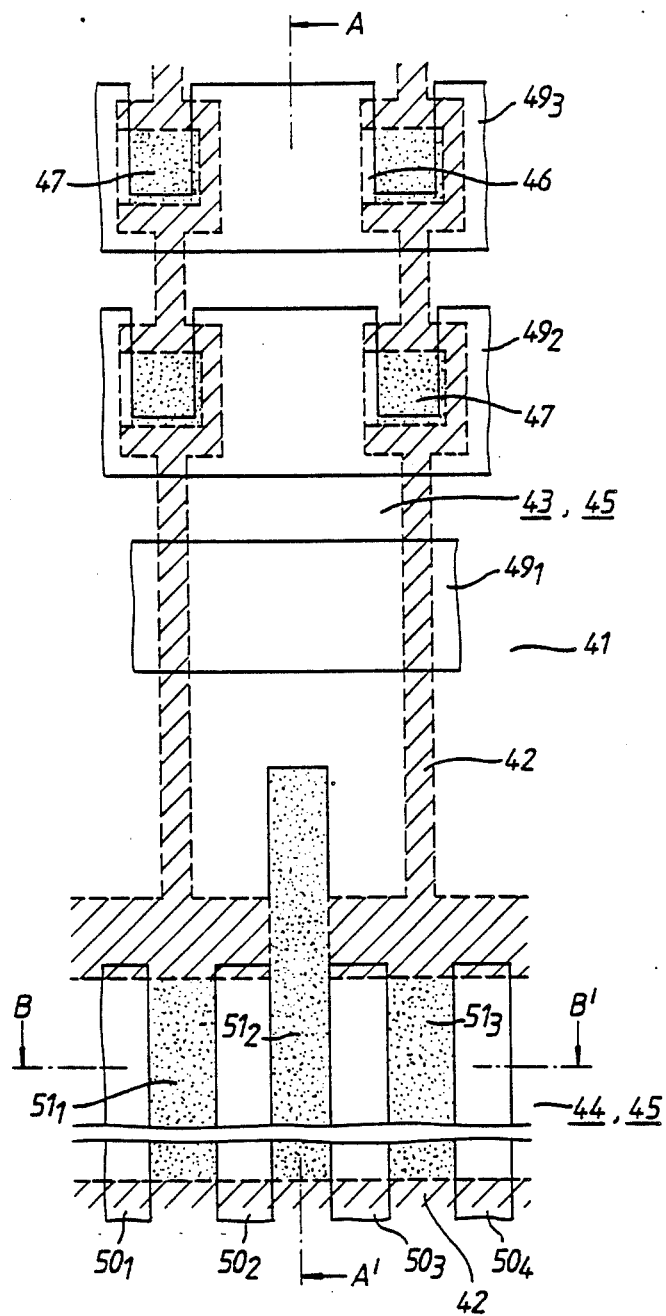
Figure 4E:
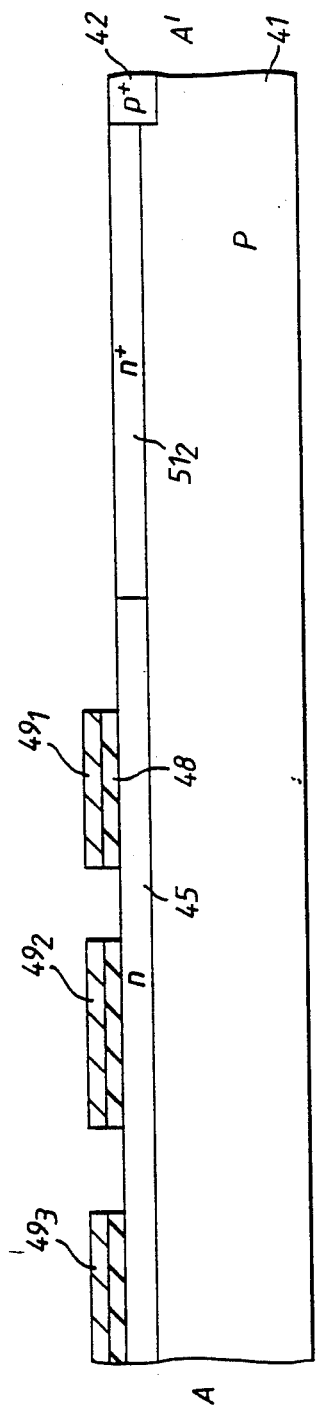
Figure 4F:
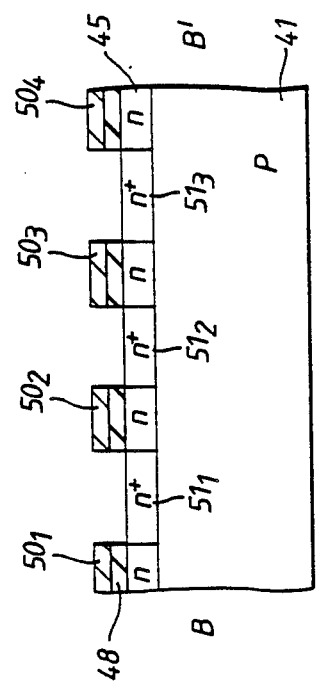

FIGS. 4d through FIG. 4f show the manufacturing steps that correspond to FIGS. 4a, FIG. 4b and FIG. 4c, respectively. FIG. 4e and FIG. 4f are the cross sectional views of FIG. 4d at A-A', B-B' respectively.

At first, to the surface of a p-type Si substrate 41 having an impurity concentration of $2 \times 10^{15}$ cm$^{-3}$, channel stop regions 42 of p$^+$-type are formed by B$^+$ (boron) ion implantation. Then, over the entire surface of the vertical CCD regions 43 and the lateral CCD region 44, n-type channel region 45 of impurity density of $6 \times 10^{17}$ cm$^{-3}$ is formed by As$^+$ (arsenic) ion implantation at 80 KeV, $4 \times 10^{12}$ cm$^{-2}$. Spaced by a gap 46 from the channel regions, n-type charge accumulation regions 47 of $1 \times 10^{12}$ cm$^{-3}$ are also formed by As$^+$ ion implantation of 80 KeV, $1 \times 10^{12}$ cm$^{-2}$.

Next, gate oxide film 48 of 900 Å thickness is grown by thermal oxidation, and the first poly-Si layer is formed. This stacked layer is patterned for transfer electrodes $49_1$, $49_2$, $49_3$ . . . of the vertical CCD region 43 and barrier transfer electrodes $50_1$, $50_2$, $50_3$, $50_4$ . . . Then, to the regions between the barrier electrode and to the latter part of the channel region of the end transfer electrode of the vertical CCD region, P$^+$ (phosphorous) ion implantation is performed at 120 KeV, $7 \times 10^{11}$ cm$^{-2}$.

These ion implantations were performed through a thin oxide film (not shown) for surface protection. This oxide film is removed before forming a gate oxide film. For instance, the thickness of the thin oxide film for P$^+$ ion implantation was 1000 Å. However, the thickness for the entire implanting of As$^+$ was thinner than this.

As shown in FIGS. 4a-4c, gate oxide films 52 of 900 Å and transfer electrodes $53_1$, $53_2$, $53_3$ . . . made of a second poly-Si layer are formed. And next, gate oxide films 54 of 900 Å and storage transfer electrodes $55_1$, $55_2$, $55_3$ . . . of a third poly-Si layer are formed. Then, CVD SiO$_2$ film 58 is deposited.

All the electrodes along the vertical CCD portion are common to all of the vertical CCDs.

Each of the vertical CCD regions 43 is driven by the clock pulse signals $\phi V_1$, $\phi V_2$, $\phi V_3$ and $\phi V_4$, the frequency of which is the KHz range. On the other hand, the lateral CCD region 44 is driven by pulse signals $\phi H_1$, $\phi H_2$ having a frequency of 14.1 MHz, higher than that of $\phi V_1$-$\phi V_4$. In the lateral CCD region, one storage transfer electrode and an adjacent barrier transfer electrode form an electrode pair, and the electrode pairs are connected alternatively along the lateral CCD region.

FIG. 5 shows the clock pulses signals $\phi V_1$-$V_4$, $\phi H_1$ and $\phi H_2$ that are supplied to the solid state image sensor shown in FIG. 4. The signals $\phi V_1$ and $\phi V_3$ have discrete levels of 7V, 0V and $-7$V, and the signals $\phi V_1$ and $\phi V_4$ have discrete levels of 0V and $-7$V. Also, $\phi H_1$ and $\phi H_2$ fluctuate between 6V and 0V. The pulses of $\phi H_1$ and $\phi H_2$ have opposite phases as shown in FIG. 5.

Figure 6A:
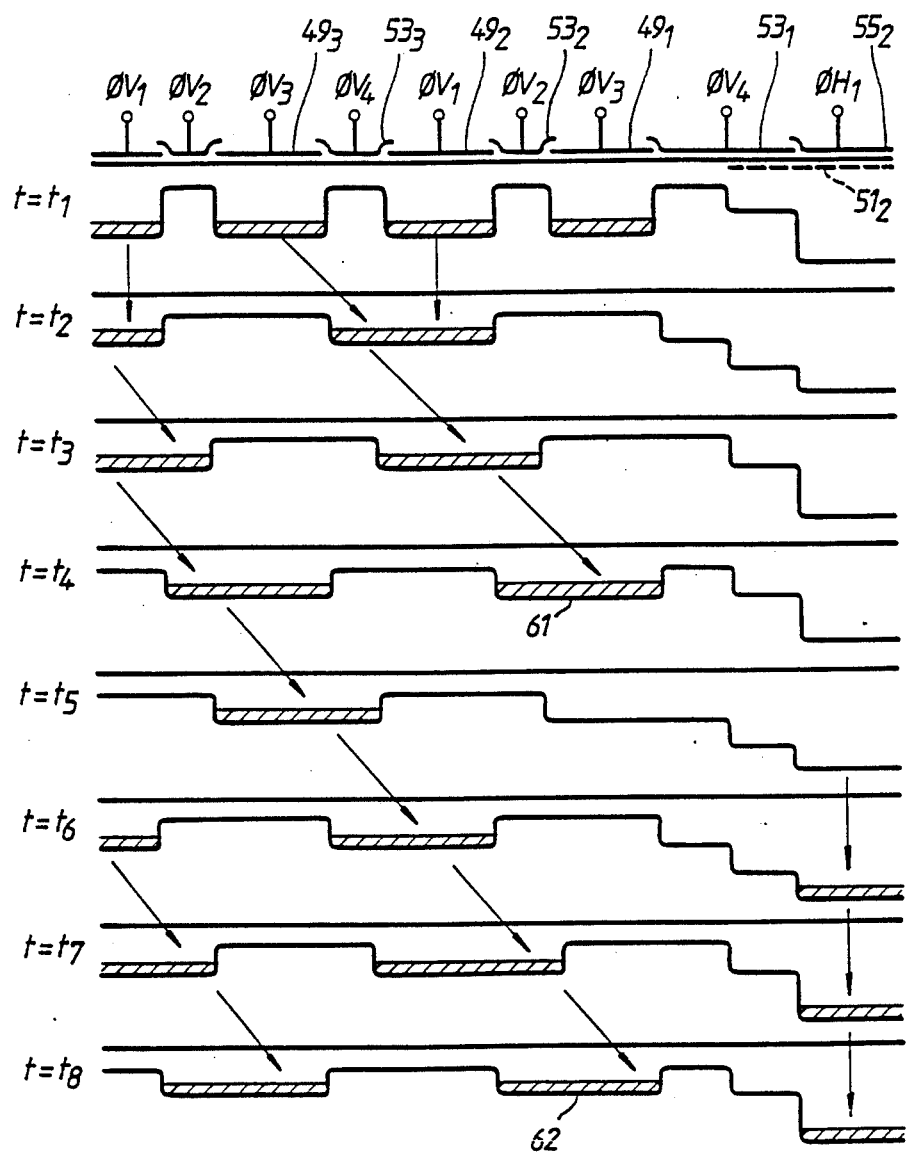
FIG. 6a and FIG. 6b show the diagrams which describe the transferring steps according to the timing chart of FIG. 5.
Figure 6B:
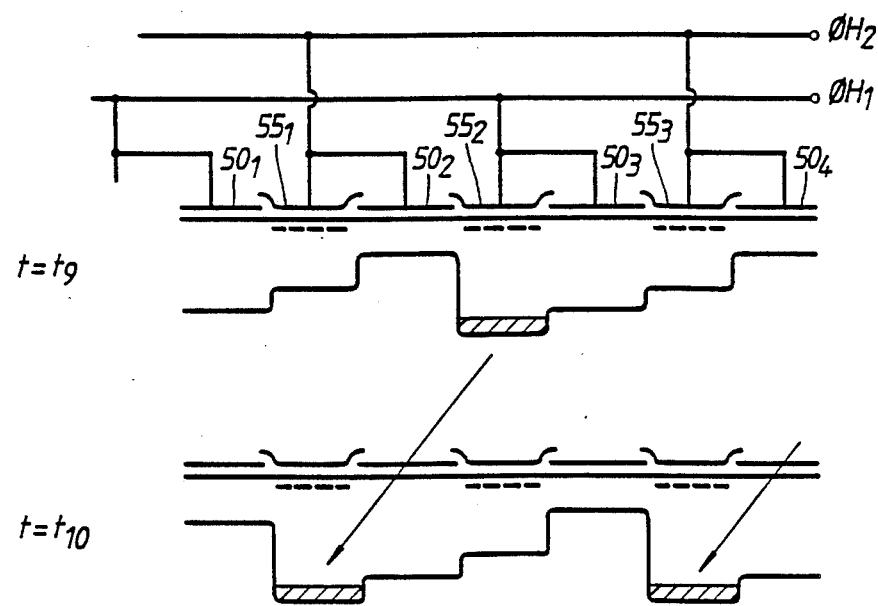

FIG. 6a and FIG. 6b show the channel potential $\phi$ at each timing.

At the timing $t=t_1$, $\phi V_1$, $\phi V_2$, $\phi V_3$ and $\phi V_4$ are set at 7V, $-7$V, 7V, $-7$V respectively for reading out the signal charges from the picture elements at the same time. Namely, the high voltage of 7V for $\phi V_1$ and $\phi V_3$ is supplied only while the readout from the picture element is required. The signal charges are electrons.

At $t=t_2$, the voltages of $\phi V_1$, $\phi V_3$ and $\phi V_4$ are changed to 0V, $-7V$, and 0V respectively. In this step, the electric charges of each pair of picture elements along the vertical CCD regions are compounded. The compounded electric charges are transferred to the exit of the vertical CCD regions step by step as the timing proceeds as shown in FIG. 6a.

At the time $t=t_4$, the first electric charges 61 are ready to be transferred to the lateral CCD region. Then, at $t=t_5$, the first electric charges 61 flow out to the lateral CCD through the end transfer electrode $53_1$ by changing the pulse signal $\phi V_4$ from $-7V$ to 0V. It will be understood that the channel potential is higher at the latter part of the end transfer electrode $53_1$ due to the existence of the $n^+$-type region $51_2$, so that the length of the flat channel potential area is decreased, and there arises an acceleration electric field E at the potential step, therefore the residual charges decrease.

The following steps $t=t_6$, $t_7$, $t_8$ are the timings for setting the second electric charges 62 to the position that corresponds to the former timing $t=t_4$. The electric charges transferred to the storage transfer electrode $55_2$ in the lateral CCD region are transferred to the left and readout from the lateral CCD region as shown in FIG. 6b.

The charge transfer from all the vertical CCD regions to the lateral CCD region is performed at the same time. Therefore, after performing the read out of the first electric charges 61, all of the second electric charges 62 of all vertical CCD regions and then all of the third ones, are read out through the lateral CCD regions by repeating the steps from $t=t_4$. This cycle will continue until the read out of the all picture elements is completed. In FIG. 5 and FIG. 6a, for the electric charges to be transferred, the charges of each two picture elements selected were combined. However, this selection may be shifted to a half pitch in the next readout cycle of the whole picture.

According to this embodiment, the length of the flat potential region of the end transfer electrode is decreased, so that the residual charge at the end region of the vertical CCD is decreased. Improved quality of the displayed image is obtained in this manner.

Although the channel length of the end transfer electrode is the largest in FIG. 4, it is not restricted to this state.

Figure 7A:
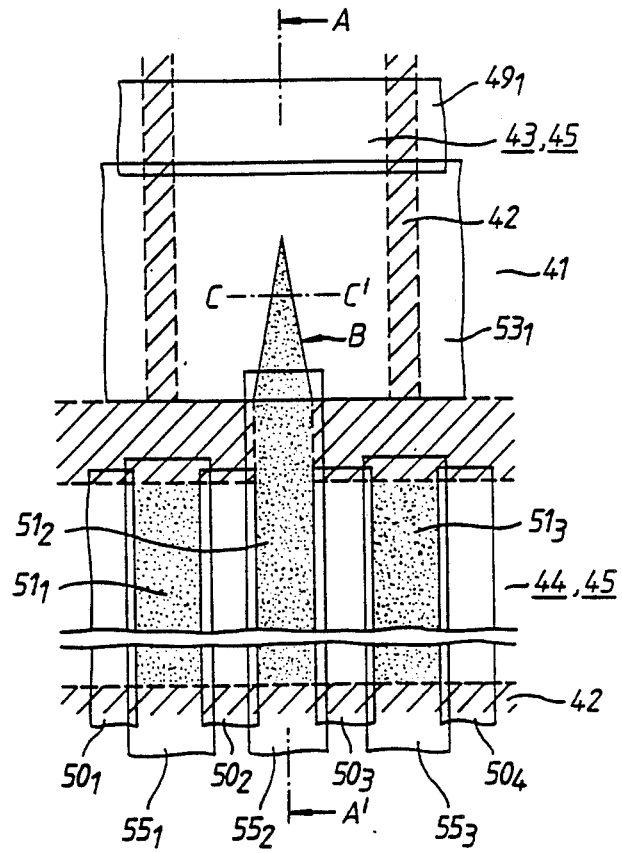
FIG. 7a and FIG. 7b are diagrams showing another embodiment of this invention.
Figure 7B:
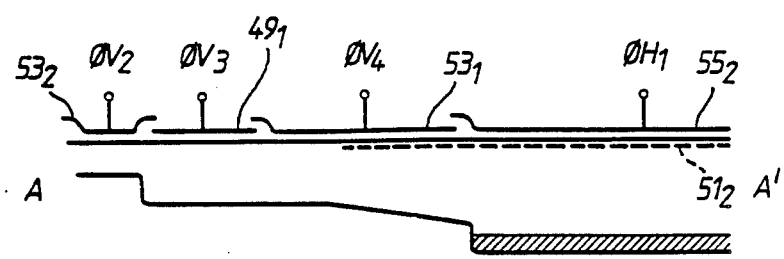

FIGS. 7a and 7b show another embodiment of this invention.

FIG. 7a shows the plan view of the connection area of the vertical CCD region and the lateral CCD region. FIG. 7b shows the channel potential of this embodiment. In FIGS. 7a and 7b, like reference numerals are used for the same parts as in FIGS. 4a-4f.

In the previous embodiment, the extended portion (A) is rectangular in shape. In comparison with this, the extended portion of the present embodiment may have the shape of a triangle (B) as shown in FIG. 7a. The shape may also be that of a trapezoid which is obtained by cutting the extended area at the C-C' line in FIG. 7a. In each case the extended area has a shape such that the width of the extended portion decreases as it extends away from the lateral CCD region. FIG. 7b shows the operational state corresponding to timing $t=t_5$ in FIG. 6a. In this embodiment, the channel potential has a potential slope at the extended portion (B) because of the narrow channel effect.

Figure 8A:
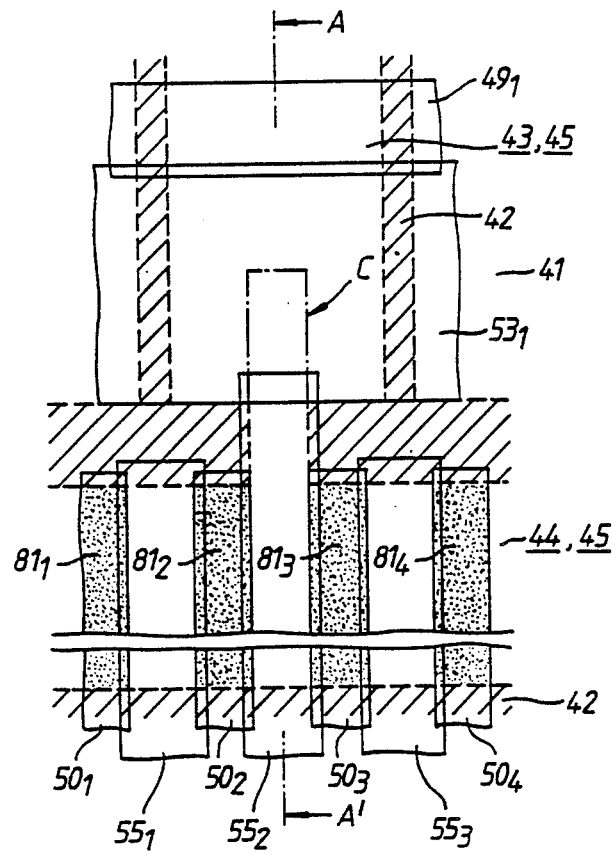
FIG. 8a and FIG. 8b are diagrams showing a further another embodiment of this invention.
Figure 8B:
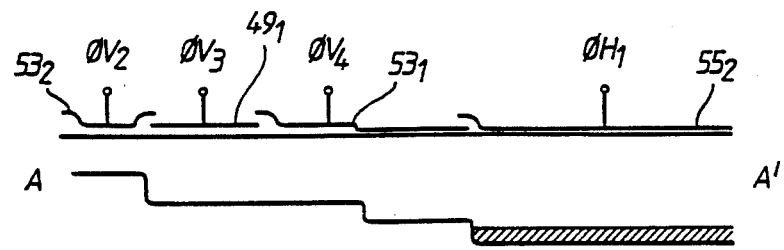

FIG. 8a and FIG. 8b show another embodiment. In the embodiments described above, $P^+$ ion implantation was performed in the area of the storage transfer electrode. In this embodiment, however, $n^-$-type regions $81_1$, $81_2$, $81_3$, $81_4$ ... are formed at the surface of the channel regions of the barrier transfer electrode by $B^+$ ion implanting. The thickness of the gate oxide film of the lateral CCD region, including the extended portion (C), is thinner than the gate oxide film of the rest of the vertical CCD region. Also by this method, a higher channel potential can be realized as shown in FIG. 8b. FIG. 8b corresponds to the timing $t=t_5$ in FIG. 6a. In this embodiment, the voltage of $\phi V_1$-$\phi V_4$, $\phi H_1$ and $\phi H_2$ in FIG. 5 was shifted about 2V respectively.

This invention is not restricted to the embodiments described above. For example, the end transfer electrode $53_1$ and storage transfer electrodes may be formed by a third poly-Si layer and a second poly-Si layer respectively. Also, the end transfer electrode may be formed by a first poly-Si layer, and the storage transfer electrode may be formed by a second or a third poly-Si layer.

Figure 9:
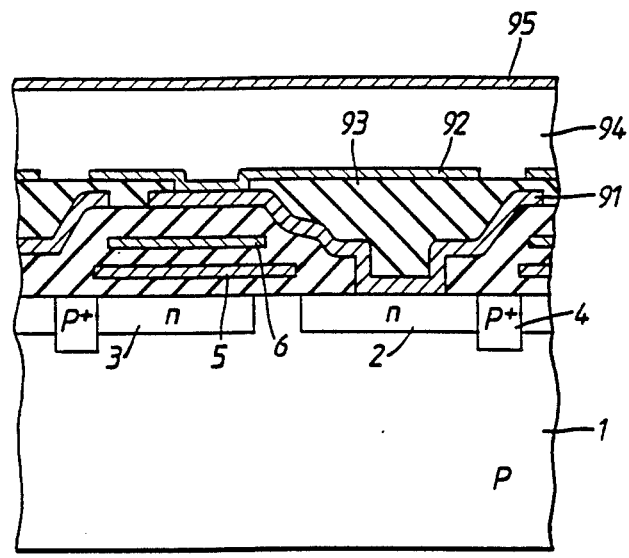
FIG. 9 is a diagram showing a stacked type CCD image sensor to which this invention can be applied.

In the embodiments described above, the end transfer electrode was a single poly-Si layer, however, a method stacking an Al or Mo layer and periodically contacting each other may be adopted. The area on the end transfer electrode may be used for an interconnection area for storage and barrier electrodes. Further, in the embodiments described above, photoelectric conversion and accumulation of the electric charges are performed at the photodiode arranged at the surface of Si substrate. However, for a device in which a photoelectric conversion layer such as an amorphous semiconductor is formed on the substrate, known as stacked type CCD image sensor, this invention also can be applied. FIG. 9 shows this type of cell. 91 and 92 are the first and second electrodes of the picture element respectively, and 93 is a PSG film. 94, 95 are the amorphous Si film and transparent electrode respectively.

The extended length $\Delta L$, in these embodiments, is preferably set to more than one-third of the channel length L of the end gate electrode as shown in FIG. 4a.

Moreover, in the embodiments described above, N-channel devices were shown. However, P-channel devices also can be applied. In such case, the latter portion has a lower channel potential.

What is claimed is:

1. A semiconductor device, comprising:
   a semiconductor substrate;
   a first CCD region formed at the surface of said semiconductor substrate, said first CCD region having a first channel region having an end portion, said end portion having a first section and an end section both of which are in said end portion, and an end transfer electrode disposed over said end section and over said first section, said end portion being defined beneath said end transfer electrode; and
   a second CCD region having a side connected to said first CCD region, said second CCD region having a second channel region directly connected to said end section, said second CCD region including a transfer electrode disposed over said second channel region, and said transfer electrode and said end transfer electrode being adjacent each other in a direction of elongation of said first CCD region;
   wherein said end section has a different impurity concentration as compared to the first section to make the potential well of said end section deeper than the potential well of said first section.

2. A semiconductor device according to claim 1, wherein said second CCD region comprises a plurality of storage transfer electrodes and barrier transfer electrodes disposed over said second channel region, and the first channel region of said first CCD region connects to a portion of the second channel region beneath one of said transfer electrodes.

3. A semiconductor device according to claim 2, wherein said end transfer electrode and said storage transfer electrode overlap each other.

4. A semiconductor device according to claim 1, wherein said semiconductor substrate is p-type and said end section has a n-type impurity concentration which is higher than that of said first section.

5. A semiconductor device according to claim 3, wherein said semiconductor substrate is p-type, and said end section and said second channel region beneath said storage transfer electrode have an n-type impurity density which is higher than that of the first section and the second channel region beneath said barrier transfer electrode.

6. A semiconductor device according to claim 1, wherein the end portion has an overall first width and said end section having said different impurity concentration has a width less than said first width.

7. A semiconductor device according to claim 1, wherein said end section has a rectangular shape.

8. A semiconductor device according to claim 1, wherein said end section has a downwardly sloped potential toward said second CCD region.

9. A semiconductor device according to claim 1, wherein said end section has a portion with said different impurity concentration which has a triangular shape.

10. A semiconductor device according to claim 1, wherein said end section has a portion with said different impurity concentration which has a trapezoidal shape.

11. A semiconductor device according to claim 1, a length of said end section in said end portion is larger than one-third a length of said end portion so that the end section forms more than one-third of the length of the end portion.

12. A semiconductor device according to claim 1, wherein said first channel region has a plurality of transfer electrodes including said end transfer electrode and a length of said end transfer electrode is larger than a length of the other transfer electrodes in said plurality of transfer electrodes of said first CCD region.

13. A semiconductor device, comprising:
a semiconductor substrate;
a plurality of charge accumulation regions which accumulate electric charges obtained by a photoelectric conversion, and are formed at the surface of said semiconductor substrate;
a plurality of first CCD regions which transfer said electric charges of said charge accumulation regions, each said first CCD region including a channel region and an end transfer electrode for controlling a potential of a corresponding portion of said channel region;
a second CCD region to which said first CCD regions are connected, said second CCD region including transfer electrodes corresponding to channel portions to which said first CCD regions are connected, and said transfer electrodes in said second CCD region and said end transfer electrode being adjacent each other in a direction of elongation of said first CCD region;
wherein, said channel region of each said first CCD region has a different channel impurity concentration area corresponding to a latter part of the end transfer electrode directly adjacent said second CCD region as compared to a remainder of said channel region corresponding to said end transfer electrode to make the potential well of said different channel impurity concentration area deeper.

* * * * *